(12) United States Patent
Suzuki

(10) Patent No.: US 8,305,143 B2
(45) Date of Patent: Nov. 6, 2012

(54) AMPLIFIER CIRCUIT AND TRANSCEIVER

(75) Inventor: Toshihide Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 281 days.

(21) Appl. No.: 12/719,208

(22) Filed: Mar. 8, 2010

(65) Prior Publication Data
US 2010/0248648 A1    Sep. 30, 2010

(30) Foreign Application Priority Data
Mar. 27, 2009    (JP) .................................. 2009-079357

(51) Int. Cl.
*H03F 3/45*    (2006.01)
(52) U.S. Cl. ....................................... 330/253; 330/261
(58) Field of Classification Search .................. 330/253, 330/261
See application file for complete search history.

(56) References Cited

U.S. PATENT DOCUMENTS

| | | | |
|---|---|---|---|
| 5,930,128 A * | 7/1999 | Dent ........................ | 330/124 R |
| 6,114,911 A | 9/2000 | Iwai et al. | |
| 6,323,733 B1 | 11/2001 | Gorcea et al. | |
| 7,890,069 B2 * | 2/2011 | Kyranas et al. ............... | 455/141 |
| 2009/0289721 A1 * | 11/2009 | Rajendran et al. ............ | 330/301 |
| 2011/0204990 A1 * | 8/2011 | Stockstad ....................... | 333/25 |

FOREIGN PATENT DOCUMENTS

| | | |
|---|---|---|
| JP | 57-131016 A | 8/1982 |
| JP | 9-307367 A | 11/1997 |
| JP | 10-190371 A | 7/1998 |
| JP | 10-308639 A | 11/1998 |
| JP | 11-274866 A | 10/1999 |

OTHER PUBLICATIONS

Gang Liu et al, "Fully Integrated CMOS Power Amplifier With Efficiency Enhancement at Power Back-Off," IEEE Journal of Solid-State Circuits, Mar. 2008, pp. 600-609, vol. 43, No. 3. Cited in Spec.
Japanese Office Action dated Apr. 24, 2012, issued in corresponding Japanese Patent Application No. 2009-079357, with Partial translation (5 pages).

(Continued)

*Primary Examiner* — Khanh V Nguyen
(74) *Attorney, Agent, or Firm* — Westerman, Hattori, Daniels & Adrian, LLP (57) ABSTRACT

An amplifier circuit includes: a field-effect transistor including a first gate, a first source and a first drain, the first gate receiving one of differential signals, and the first source being connected to a reference potential node; a field-effect transistor including a second gate, a second source and a second drain, the second gate receiving the other of the differential signals, and the second source being connected to a reference potential node; a first transformer including a first inductor and a first secondary inductor which are magnetically coupled together, the first inductor being connected between the first drain of the first field-effect transistor and the second drain of the second field-effect transistor, and the first secondary inductor being connected between an output terminal and a reference potential node; and a first switch circuit connecting a power-supply potential node or a reference potential node to a midpoint of the first inductor.

10 Claims, 7 Drawing Sheets

OTHER PUBLICATIONS

European Search Report dated Feb. 2, 2012, issued in corresponding European Patent Application No. 10157103.2.

Haitao Gan et al., "Integrated Transformer Baluns for RF Low Noise and Power Amplifiers", Radio Frequency Integrated Circuits (RFIC) Symposium, 2006 IEEE, IEEE, Piscataway, NJ, USA, Jun. 11, 2006, pp. 69-72, XP010925118.(cited in European Search Report dated Feb. 2, 2012).

Chinese Office Action dated Aug. 1, 2012, issued in corresponding Chinese Patent Application No. 201010151093X with an English translation (13 pages).

* cited by examiner

AMPLIFIER CIRCUIT AND TRANSCEIVER

CROSS REFERENCE TO RELATED APPLICATION

This application is based upon and claims the benefit of priority from the prior Japanese Patent Application NO. 2009-079357 filed on Mar. 27, 2009, the entire contents of which are incorporated herein by reference.

FIELD

The embodiments discussed herein are related to an amplifier circuit and a transceiver.

BACKGROUND

It is commonly the case that in order to reduce power consumption in radio transceivers, signal output power is changed according to the communication distance. There are techniques that changes the number of active high-output amplifiers provided in the last stage of a transceiver according to signal output power to allow the radio transceiver to operate with the optimum power efficiency at all times.

An amplifier circuit using a transformer is disclosed in "Fully Integrated CMOS Power Amplifier With Efficiency Enhancement at Power Back-Off", G, Liu, P. Haldi, T.-J. K. Liu, and A. M. Niknejad, IEEE Journal of Solid-State Circuits, Vol. 43, No. 3, pp. 600-609, March 2008. Japanese Laid-Open Patent Publication No. 9-307367 discloses a power combining method using multiple bridge-type single-ended push-pull power amplifiers which amplify an input RF input signal and output the amplified RF input signal to a common combining transformer, in which no bias voltage is supplied to transistors constituting a bridge-type single-ended push-pull circuit to which the RF signal is not input.

SUMMARY

According to one aspect of the present invention, there is provided an amplifier circuit which includes a first field-effect transistor including a first gate which receives one of differential signals, a first source connected to a reference potential node, and a first drain. The amplifier circuit also includes a second field-effect transistor including a second gate which receives the other of the differential signals, a second source connected to a reference potential node, and a second drain. The amplifier circuit further includes a first transformer including a first primary inductor and a first secondary inductor which are magnetically coupled together. The first primary inductor is connected between the first drain of the first field-effect transistor and the second drain of the second field-effect transistor. The first secondary inductor is connected between an output terminal and a reference potential node. The amplifier circuit also includes a first switch circuit which connects a power-supply potential node or a reference potential node to a midpoint of the first primary inductor.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

DESCRIPTION OF EMBODIMENTS (Related Art)

Figure 1:
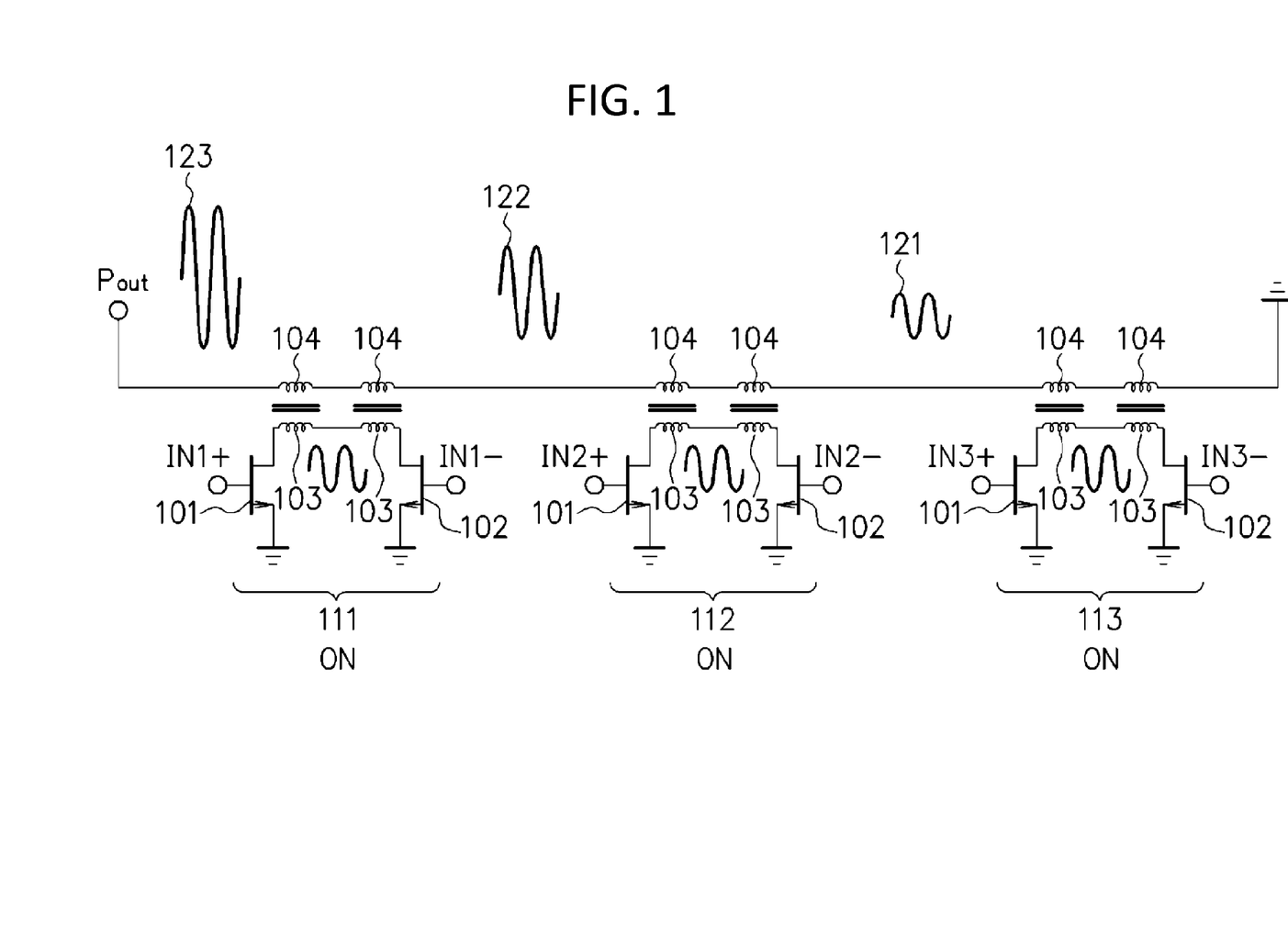
FIG. 1 is a circuit diagram illustrating an exemplary configuration of an amplifier.

FIG. 1 is a circuit diagram illustrating an exemplary configuration of an amplifier circuit. The amplifier circuit includes first, second and third amplifiers 111, 112 and 113. Each of the amplifiers 111, 112 and 113 includes a first field-effect transistor 101, a second field-effect transistor 102, a primary inductor 103, and a secondary inductor 104. The primary inductor 103 and the secondary inductor 104 are magnetically coupled together to form a transformer.

In the first amplifier 111, differential signals are input to nodes IN1+ and IN1− of the gate of the first field-effect transistor 101 and the gate of the second field-effect transistor 102, respectively. In the second amplifier 112, differential signals are input into nodes IN2+ and IN2− of the gate of the first field-effect transistor 101 and the gate of the second field-effect transistor 102, respectively. In the third amplifier 113, differential signals are input to nodes IN3+ and IN3− of the gate of the first field-effect transistor 101 and the gate of the second field-effect transistor 102, respectively. The differential signals input to nodes IN1+, IN2+ and IN3+ are identical; the differential signals input to nodes IN1−, IN2− and IN3− are identical.

Signal 121 in FIG. 1 is the signal amplified by the third amplifier 113. Signal 122 is a combined signal of the signal amplified by the second amplifier 112 and the signal amplified by the third amplifier 113. Signal 123 is a combined signal of the signal amplified by the first amplifier 111, the signal amplified by the second amplifier 112, and the signal amplified by the third amplifier 113. The combined signal 123 of the signals amplified by the three amplifiers 111 to 113 is output through an output terminal Pout.

Any of the three amplifiers 111 to 113 can be activated to perform amplification. When any of the amplifiers 111 to 113 are deactivated, a problem arises that since the primary inductor 103 and the secondary inductor 104 of the transformers are magnetically coupled together, high-frequency power enters the deactivated or amplifiers from activated amplifier(s) and is consumed through the capacitance between the source and the drain of each of the field-effect transistors 101 and 102 of the disabled amplifier. An amplifier circuit that solves the problem will be described with reference to FIG. 2.

Figure 2:
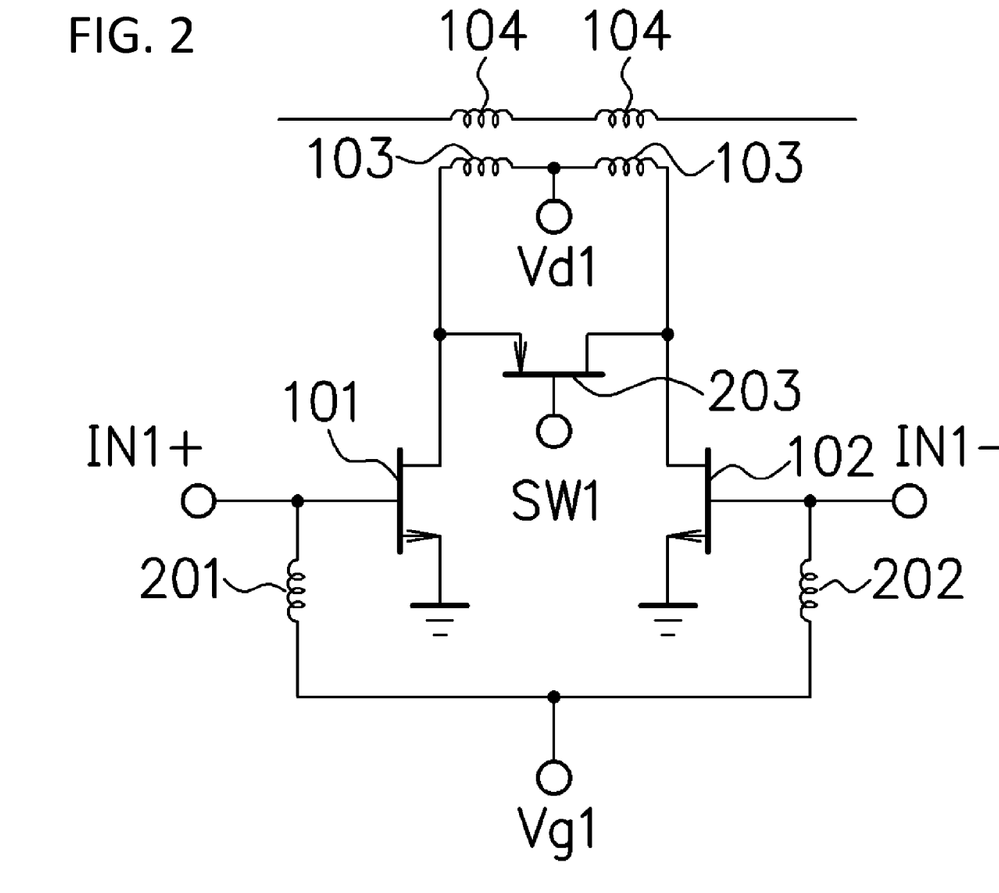
FIG. 2 is a circuit diagram illustrating another exemplary amplifier configuration.

FIG. 2 is a circuit diagram illustrating another exemplary amplifier configuration. The amplifier in FIG. 2 includes a first inductor 201, a second inductor 202, and a field-effect transistor 203 in addition to the components of the amplifier in FIG. 1. A gate bias node Vg1 is connected to the inductors 201 and 202. A power-supply potential node Vd1 is connected to the midpoint of the primary inductor 103. When the amplifier is deactivated, the field-effect transistor 203 is turned on to prevent the high-frequency power from entering the deactivated amplifier.

On the other hand, when the amplifier is activated, the field-effect transistor 203 is turned off. In this state, degradation of high-frequency characteristics and unnecessary power loss in the field-effect transistor 203 occur because the capacitance between the source and the drain of the field-effect transistor 203 is added, compared the circuit in FIG. 1.

Amplifier circuits according to embodiments capable of preventing unnecessary power loss and/or degradation of high-frequency characteristics will be described below.

(First Embodiment)

Figure 3:
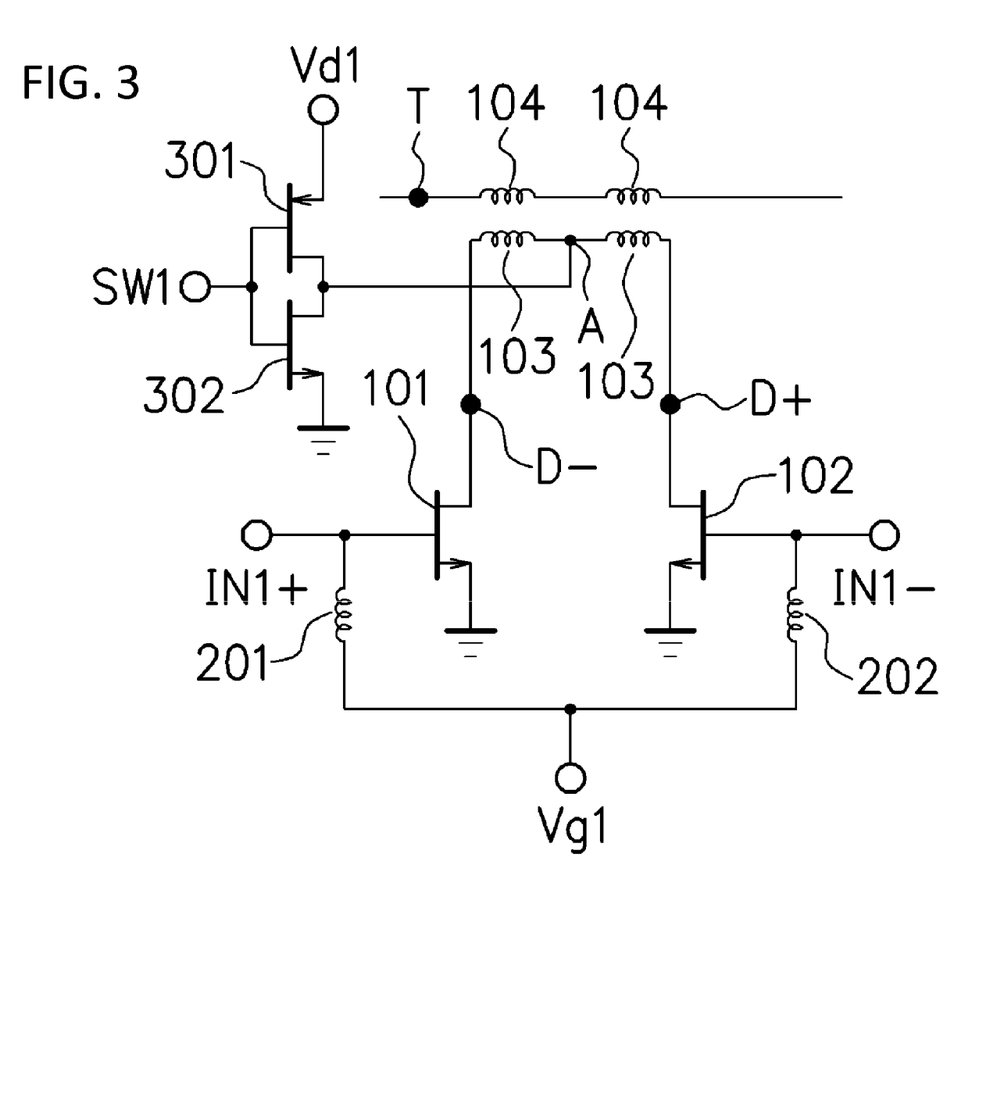
FIG. 3 is a circuit diagram illustrating an exemplary configuration of a transceiver including an amplifier circuit according to a first embodiment of the present invention.

FIG. 3 is a circuit diagram illustrating an exemplary configuration of a transceiver including an amplifier circuit according to a first embodiment of the present invention. FIG. 3 depicts an amplifier equivalent to a first amplifier 611 depicted in FIG. 6. The amplifier is a high-output amplifier used in an application such as a radio transceiver.

A first field-effect transistor 101, which is an n-channel field-effect transistor, includes a first gate, a first source and a first drain. One of differential signals is input to node IN1+ of the first gate and the first source is connected to a reference potential node. Node D− is the node of the first drain of the first field-effect transistor 101.

A second field-effect transistor 102, which is an n-channel field-effect transistor, includes a second gate, a second source and a second drain. The other of the differential signals is input to node IN1− of the second gate and the second source is connected to the reference potential node. Node D+ is the node of the second drain of the second field-effect transistor 102. The differential signals input to nodes IN1+ and IN1− have opposite phases.

Figure 6:
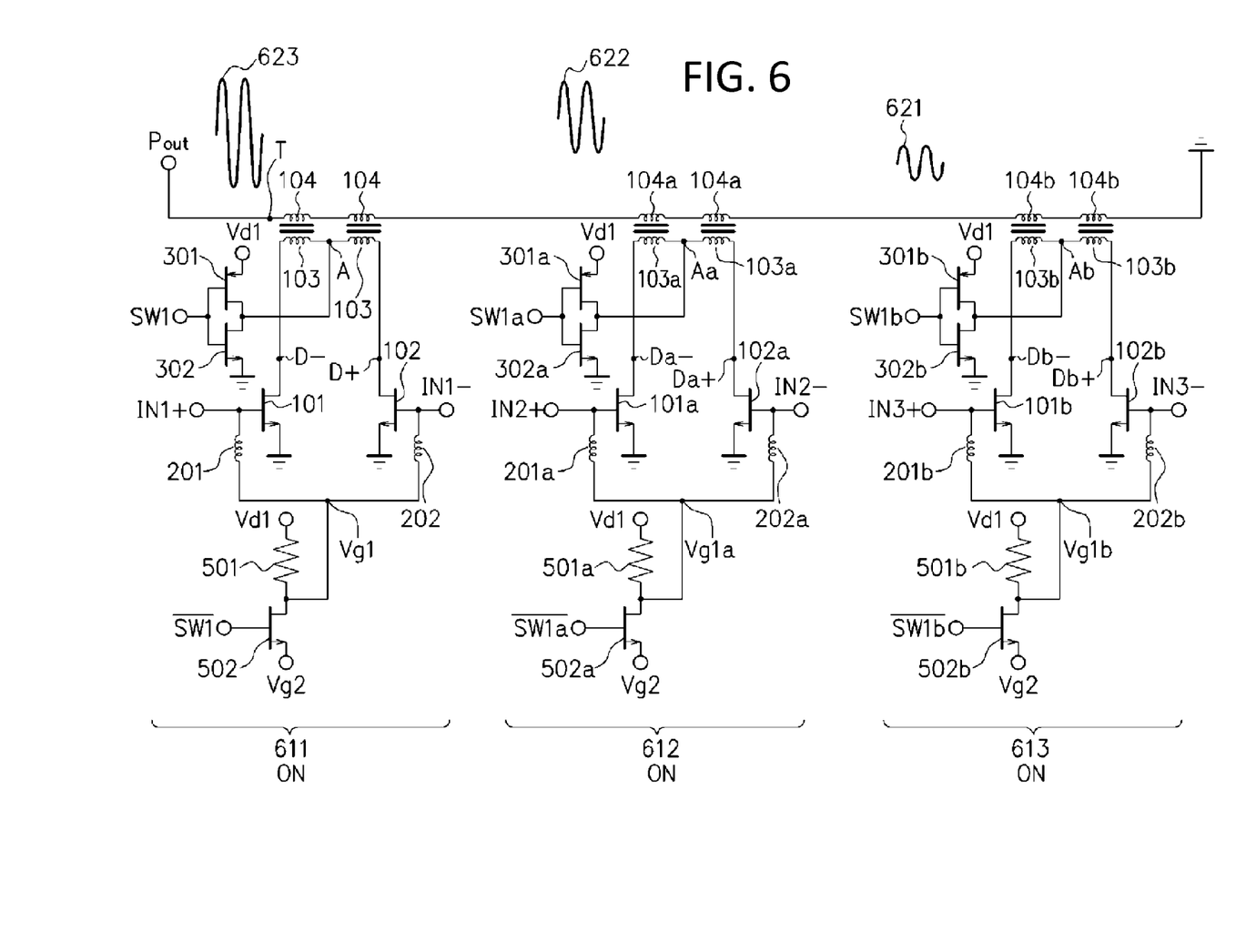
FIG. 6 is a circuit diagram illustrating an exemplary configuration of a transceiver including an amplifier circuit according to a third embodiment of the present invention.

A first transformer includes first primary inductor 103 and first secondary inductor 104 which are magnetically coupled together. The first primary inductor 103 is connected between the first drain of the first field-effect transistor 101 and the second drain of the second field-effect transistor 102. The first secondary inductor 104 is connected between an output terminal Pout and the reference potential node as depicted in FIG. 6. Node A is the midpoint of the first primary inductors 103. Node T is the node of the first secondary inductor 104.

A first switch circuit is an inverter including a p-channel field-effect transistor 301 and an n-channel field-effect transistor 302. The first switch connects a power-supply potential node Vd1 or the reference potential node to node A at the midpoint of the first primary inductor 103. The p-channel field-effect transistor 301 receives a signal SW1 at its gate. The source of the p-channel field-effect transistor 301 is connected to the power-supply potential node Vd1 and the drain is connected to node A at the midpoint of the first primary inductor 103. The n-channel field-effect transistor 302 receives the signal SW1 at its gate. The source of the n-channel field-effect transistor 302 is connected to the reference potential node and the drain is connected to node A at the midpoint of the first primary inductor 103.

A first inductor 201 is connected between the first gate of the first field-effect transistor 101 and a gate bias node Vg1. A second inductor 202 is connected between the second gate of the second field-effect transistor 102 and the gate bias node Vg1.

Figure 4:
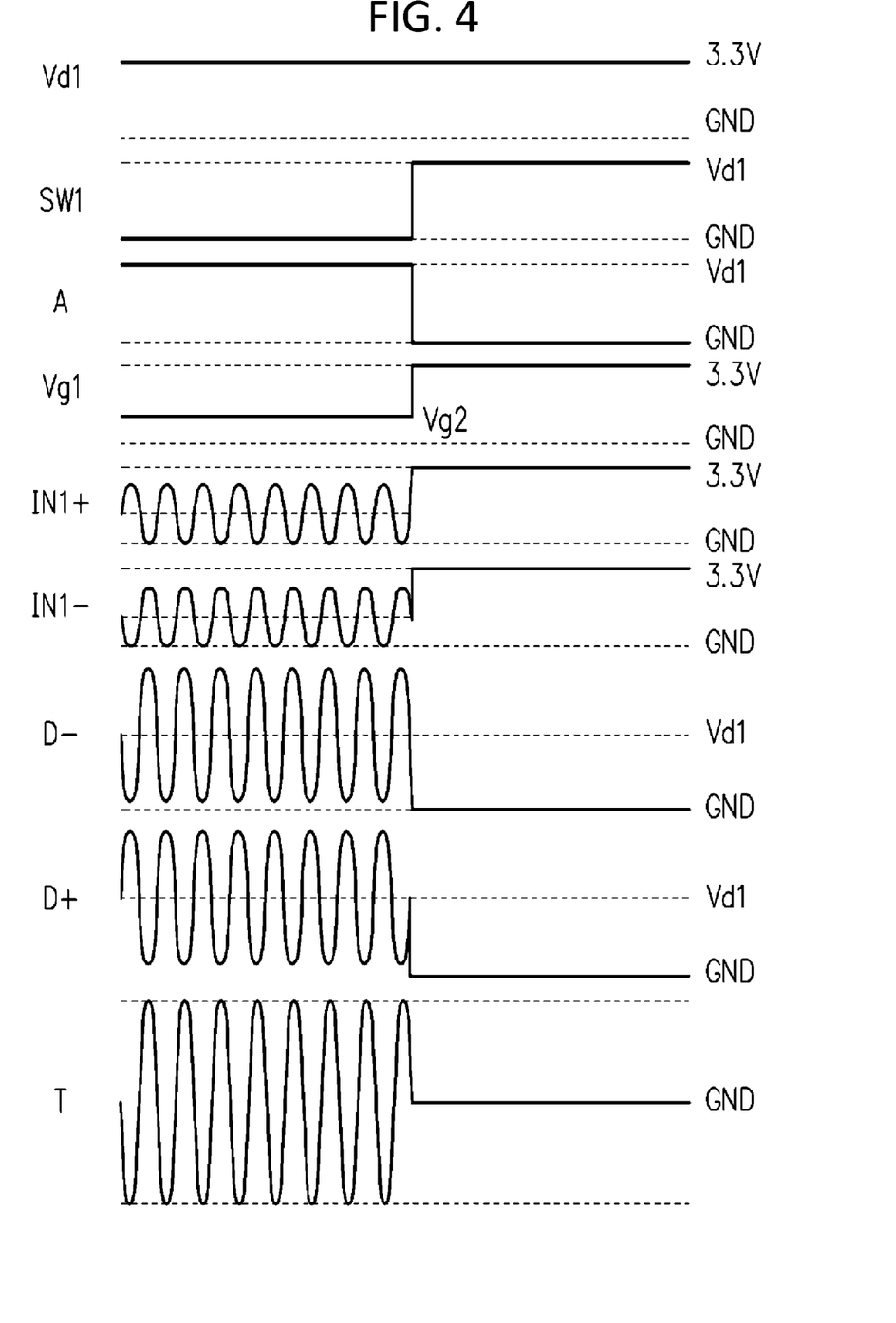
FIG. 4 is a timing chart illustrating an exemplary operation of the amplifier illustrated in FIG. 3.

FIG. 4 is a timing chart illustrating an exemplary operation of the amplifier in FIG. 3. The power-supply potential node Vd1 is at 3.3V, for example. The left half of FIG. 4 represents a state in which the amplifier is active and the right half of FIG. 4 represents a state in which the amplifier is inactive.

The amplifier active state depicted in the left half of FIG. 4 will be described first. In the amplifier active state, the signal SW1 is at a low level and the gate bias node Vg1 is at the potential of a second bias node Vg2, and differential signals are input to nodes IN+ and IN−. The potential of the second bias node Vg2 is higher than the potential of the reference potential node (for example the ground potential node) GND and lower than the power-supply potential (3.3 V). The potential of each of nodes IN1+ and IN− is the combined potential of the potential of the gate bias node Vg1 and the potential of each differential signal.

When the signal SW1 goes low, the p-channel field-effect transistor 301 turns on and the n-channel field-effect transistor 302 turns off. Then, the potential of node A at the midpoint of the first primary inductor 103 becomes equal to the potential of the power-supply potential node Vd1. As a result, the first and second field-effect transistors 101 and 102 are supplied with a drain bias and are enabled to perform amplification.

The first field-effect transistor 101 inverts and amplifies the signal at node IN1+ of the first gate and outputs the inverted and amplified signal to node D− of the first drain. The second field-effect transistor 102 inverts and amplifies the signal at node IN1− of the second gate and outputs the inverted and amplified signal to node D+ of the second drain. Since the signals at nodes IN1+ and IN− are differential signals, the signals at nodes D+ and D− are also differential signals. Since the first primary inductor 103 and the first secondary inductor 104 are magnetically coupled together, a difference signal between the signals at nodes D+ and D− is induced at node T of the first secondary inductor 104. Thus, the amplifier can output the amplified signal to node T.

In the amplifier active state, when the first switch circuit formed by the transistors 301 and 302 connects the power-supply potential node Vd1 to node A at the midpoint of the first primary inductor 103, differential signals are input to the first gate of the first field-effect transistor 101 and the second gate of the second field-effect transistor 102.

The amplifier inactive state illustrated in the right half of FIG. 4 will be described next. In the amplifier inactive state, the signal SW1 is at a high level, the potential at the gate bias node Vg1 is equal to the power-supply potential (3.3 V), and the differential signals are not input to nodes IN1+ and IN1−. The potential of each of nodes IN1+ and IN1− is equal to the potential at the gate bias node Vg1.

When the signal SW1 goes high, the p-channel field-effect transistor 301 turns off and the n-channel field-effect transistor 302 turns on. Then, the potential of node A at the midpoint of the first primary inductor 103 becomes equal to the potential at the reference potential node GND. Consequently, the first and second field-effect transistors 101 and 102 are not supplied with the drain bias and do not perform amplification. Since the gate bias node Vg1 is at the high level, the first and second field-effect transistors 101 and 102 are turned on. Then, the potential at nodes D− and D+ becomes equal to the potential at the reference potential node GND. Consequently, the potential at node T of the first secondary inductor 104 also becomes equal to the potential at the reference potential node GND. Thus the amplifier in the amplifier inactive state does not output an amplified signal to node T of the first secondary inductor 104.

In the amplifier inactive state, when the first switch circuit formed by the transistors 301 and 302 connects the reference potential node GND to node A at the midpoint of the first primary inductor 103, the differential signals are not input into the first gate of the first field-effect transistor 101 and the second gate of the second field-effect transistor 102.

As has been described, in the amplifier of the present embodiment, the first switch circuit formed by the transistors 301 and 302 is connected to node A at the midpoint of the first primary inductor 103. When the amplifier is to be activated, the signal SW1 is forced low so that the potential equal to the potential at the power-supply potential node VD1 is applied to node A. In this case, the transistors 101 and 102 of the differential amplifier amplify input RF differential signals and output an amplified signal to the output terminal Pout through the transformer formed by the inductors 103 and 104. On the other hand, when the amplifier is to be deactivated, the signal SW1 is forced high so that the potential equal to the potential at the reference potential node GND is applied to node A. The potential equal to that at the power-supply potential node Vd1 is applied to the gate bias node Vg1 of the transistors 101 and 102 of the differential amplifier. Here, the transistors 101 and 102 constituting the differential amplifier themselves act as a switch and turn on to cause a DC short between node A and the reference potential node GND. While the source and drain of the transistors 101 and 102 of the differential amplifier are shorted, node A is connected to the reference potential node GND. Accordingly, no power-supply current is supplied to the transistors 101 and 102 of the differential amplifier and no power is consumed in the amplifier.

Specifically, in the amplifier inactive state, the signal SW1 is forced high to connect the reference potential node GND to node A. Then, the power-supply potential (3.3 V) is supplied to the gate bias node Vg1 and the transistors 101 and 102 of the differential amplifier are turned on. This brings the source and drain of the transistors 101 and 102 into conduction and node A is shorted to the reference potential node GND. That is, nodes D− and D+ across the first primary inductor 103 of the transformer are shorted to the reference potential node GND. This prevents high-frequency power from entering the amplifier through the transformer, thereby avoiding power consumption in the amplifier.

Thus, unnecessary power loss can be prevented. While the first switch circuit formed by the transistors 301 and 302 are connected to node A, the connection of the first switch circuit formed by the transistors 301 and 302 does not have an adverse effect on the amplifier because node A corresponds to a wave node relative to Vd1. Thus degradation of high-frequency characteristics due to the connection of the first switch circuit formed by the transistors 301 and 302 can be avoided.

(Second Embodiment)

Figure 5:
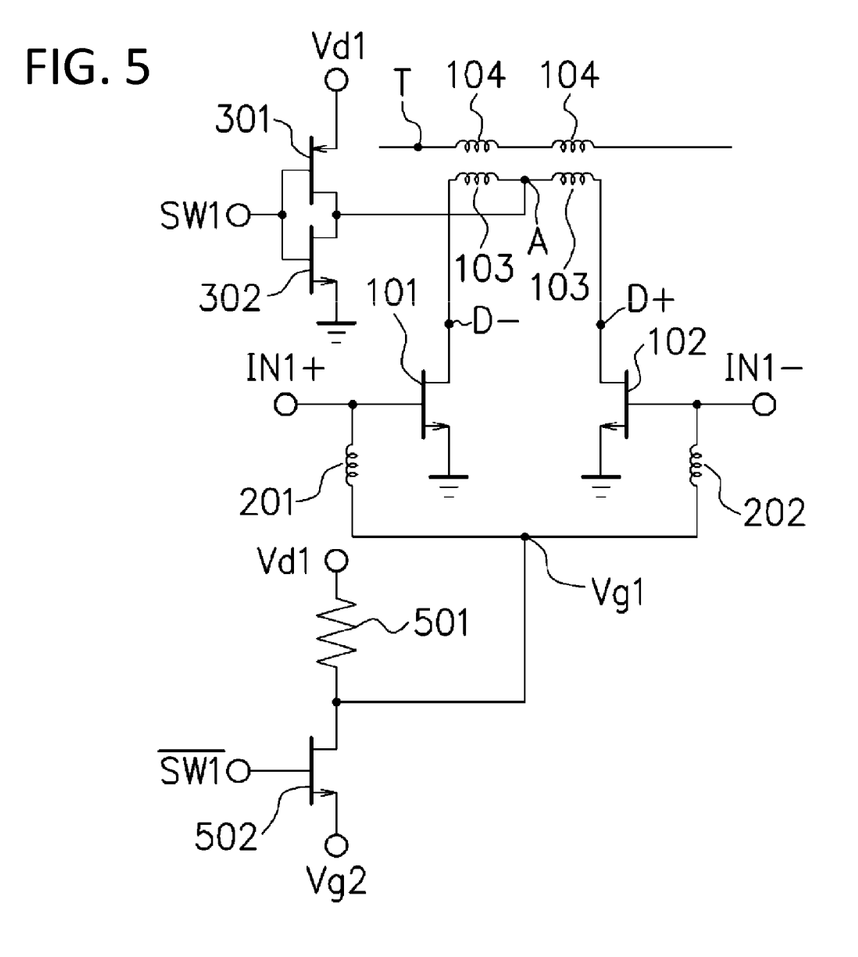
FIG. 5 is a circuit diagram illustrating an exemplary configuration of a transceiver including an amplifier circuit according to a second embodiment of the present invention.

FIG. 5 is a circuit diagram illustrating an exemplary configuration of a transceiver including an amplifier circuit according to a second embodiment of the present invention. FIG. 5 depicts an amplifier equivalent to an amplifier 611 depicted in FIG. 6. The second embodiment includes a resistance 501 and a transistor 502 in addition to the components in the configuration of the first embodiment (FIG. 3). Illustrated is an exemplary circuit for applying a gate bias to a gate bias node Vg1. Differences of the second embodiment from the first embodiment will be described below.

The resistance 501 is connected between a power-supply potential node Vd1 and the gate bias node Vg1. The n-channel field-effect transistor 502 receives a signal /SW1 at its gate. The drain of the n-channel field-effect transistor 502 is connected to the gate bias node Vg1 and the source is connected to a bias node Vg2. The signal /SW1 is the inverted signal of a signal SW1.

The resistance 501 and the transistor 502 form a bias switch circuit which connects the power-supply potential node (first bias node) Vd1 or the bias node (second bias node) Vg2 to the gate bias node Vg1.

The potential at the power-supply potential node (first bias node) Vd1 is higher than that at the bias node (second bias node) Vg2. As illustrated in FIG. 5, when the switch circuit formed by the transistors 301 and 302 connects the power-supply potential node Vd1 to node A at the midpoint of the first primary inductor 103, the bias switch circuit formed by the resistance 501 and the transistor 502 connects the bias node (second bias node) Vg2 to the gate bias node Vg1. On the other hand, when the first switch circuit formed by the transistors 301 and 302 connects the reference potential node GND to node A at the midpoint of the first primary inductor 103, the bias switch circuit formed by the resistance 501 and the transistor 502 connects the power-supply potential node (first bias node) Vd1 to the gate bias node Vg1.

As illustrated in the left half of FIG. 4, when the amplifier is to be activated, the signal SW1 is forced low to connect the power-supply potential node Vd1 to node A. At this time, the signal /SW1 goes high and therefore the transistor 502 is turned on. As a result, the bias node Vg2 is connected to the gate bias node Vg1. The differential amplifier formed by the transistors 101 and 102 amplifies input RF differential signals and outputs an amplified signal to the output terminal Pout through the transformer.

On the other hand, when the amplifier is to be deactivated as illustrated in the right half of FIG. 4, the signal SW1 is forced high to connect the reference potential node GND to node A. At this time, the signal /SW1 goes low and therefore the transistor 502 is turned off. The gate bias node Vg1 is disconnected from the bias node Vg2 and is connected to the power-supply potential node Vd1 instead. The drain and source of the transistors 101 and 102 forming the differential amplifier are DC-shorted. Thus, unnecessary power loss can be prevented.

(Third Embodiment)

FIG. 6 is a circuit diagram illustrating an exemplary configuration of a transceiver including an amplifier circuit according to a third embodiment of the present invention. The embodiment includes amplifies 612 and 613 in addition to the components in the second embodiment (FIG. 5). Differences of the present embodiment from the second embodiment will be described below.

The amplifier circuit includes first, second and third amplifiers 611, 612 and 613. The first amplifier 611 has the same configuration as the amplifier in FIG. 5 and therefore the description of the amplifier 611 will be omitted. The amplifiers 612 and 613 have a configuration similar to that of the amplifier 611. An identical signal is selectively input to nodes IN1+, IN2+ and IN3+. An identical signal is selectively input to nodes IN1−, In2− and In3−. First, second and third secondary inductors 104, 104a and 104b are connected in series between the output terminal Pout and a reference potential node.

The configuration of the second amplifier 612 will be described first. A third field-effect transistor 101a, which is an n-channel field-effect transistor, includes a third gate, a third source and a third drain. One of differential signals is input to node In2+ of the third gate. The third source is connected to a referential potential node. Node Da− is the node of the third drain of the third field-effect transistor 101a. A fourth field-effect transistor 102a, which is an n-channel field-effect transistor, includes a fourth gate, a fourth source and a fourth drain. The other of the differential signals is input to node IN2− of the fourth gate. The fourth source is connected to the reference potential node. Node Da+ is the node of the fourth drain of the fourth field-effect transistor 102. The differential signals input to nodes IN2+ and IN2− have opposite phases. A second transformer includes a second primary inductor 103a and a second secondary inductor 104a which are magnetically coupled together. The second primary inductor 103a is connected between the third drain of the third field-effect transistor 101a and the fourth drain of the fourth field-effect transistor 102a. The second secondary inductor 104a is connected with the first secondary inductor 104 and the third secondary inductor 104b in series between the output terminal Pout and the reference potential node. Node Aa is the node at the midpoint of the second primary inductor 103a. A second switch circuit is an inverter including a p-channel field-effect transistor 301a and an n-channel field-effect transistor 302a. The second switch circuit connects the power-supply potential node Vd1 or the reference potential node to the node Aa at the midpoint of the second primary inductor 103a. The p-channel field-effect transistor 301a receives a signal SW1a at its gate. The source of the p-channel field-effect transistor 301a is connected to the power-supply potential node Vd1 and the drain is connected to node Aa at the midpoint of the second primary inductor 103a. The n-channel field-effect transistor 302a receives the signal SW1a at its gate. The source of the n-channel field-effect transistor 302a is connected to the reference potential node and the drain is connected to node Aa at the midpoint of the second primary inductor 103a. A third inductor 201a is connected between the third gate of the third field-effect transistor 101a and a gate bias node Vg1a. A fourth inductor 202a is connected between the fourth gate of the fourth field-effect transistor 102a and the gate bias node Vg1a. A resistance 501a is connected between the power-supply potential node Vd1 and the gate bias node Vg1a. An n-channel field-effect transistor 502a receives a signal /SW1a at its gate. The drain of the n-channel field-effect transistor 502a is connected to the gate bias node Vg1a and the source is connected to a bias node Vg2. The signal /SW1a is the inverted signal of a signal SW1a.

The configuration of the third amplifier 613 will be described next. A fifth field-effect transistor 101b, which is an n-channel field-effect transistor, includes a fifth gate, a fifth source and a fifth drain. One of differential signals is input to node IN3+ of the fifth gate. The fifth source is connected to a reference potential node. Node Db− is the node of the fifth drain of the fifth field-effect transistor 101b. A sixth field-effect transistor 102b, which is an n-channel field-effect transistor, includes a sixth gate, a sixth source and a sixth drain. The other of the differential signals is input to node IN3− of the sixth gate and the sixth source is connected to a reference potential node. Node Db+ is the node of the sixth drain of the sixth field-effect transistor 102b. The differential signals input to nodes IN3+ and IN3− have opposite phases. A third transformer includes a third primary inductor 103b and a third secondary inductor 104b which are magnetically coupled together. The third primary inductor 103b is connected between the fifth drain of the fifth field-effect transistor 101b and the sixth drain of the sixth field-effect transistor 102b. The third secondary inductor 104b is connected with the first secondary inductor 104 and the second secondary inductor 104a in series between the output terminal Pout and the reference potential node. Node Ab is the node at the midpoint of the third primary inductor 103b. A third switch circuit is an inverter including a p-channel field-effect transistor 301b and an n-channel field-effect transistor 302b. The third switch circuit connects the power-supply potential node Vd1 or the reference potential node to node Ab at the midpoint of the third primary inductor 103b. The p-channel field-effect transistor 301b receives a signal SW1b at its gate. The source of the p-channel field-effect transistor 301b is connected to the power-supply potential node Vd1 and the drain is connected to node Ab at the midpoint of the third primary inductor 103b. The n-channel field-effect transistor 302b receives the signal SW1b at its gate. The source of the n-channel field-effect transistor 302b is connected to the reference potential node and the drain is connected to node Ab at the midpoint of the third primary inductor 103b. A fifth inductor 201b is connected between the fifth gate of the fifth field-effect transistor 101b and the gate bias node Vg1b. A sixth inductor 202b is connected between the sixth gate of the sixth field-effect transistor 102b and the gate bias node Vg1b. A resistance 501b is connected between the power-supply potential node Vd1 and the gate bias node Vg1b. An n-channel field-effect transistor 502b receives a signal /SW1b at its gate. The drain of the n-channel field-effect transistor 502b is connected to the gate bias node Vg1b and the source is connected to a bias node Vg2. The signal /SW1b is the inverted signal of the signal SW1b.

The first amplifier 611 is activated by forcing the signal SW1 low and the signal /SW1 high to input differential signals in nodes IN1+ and IN1−. The first amplifier 611 is deactivated by forcing the signal SW1 high and the signal /SW1 low to prevent the differential signals from being input to nodes IN1+ and IN1−.

Similarly, the second amplifier 612 is activated by forcing the signal SW1a low and the signal /SW1a high to input differential signals to nodes IN2+ and IN2−. The second amplifier 612 is deactivated by forcing the signal SW1a high and the signal /SW1a low to prevent the differential signals from being input to nodes IN2+ and IN2−.

Likewise, the third amplifier 613 is activated by forcing the signal SW1b low and the signal /SW1b high to input differential signals to nodes IN3+ and IN3−. The third amplifier 613 is deactivated by forcing the signal SW1b high and the signal /SW1b low to prevent the differential signals from being input to nodes IN3+ and IN3−.

All of the first to third amplifiers 611 to 613 are depicted as being in the active state in FIG. 6. Signal 621 is a signal amplified by the third amplifier 613. Signal 622 is a combined signal of the signal amplified by the second amplifier 612 and the signal amplified by the third amplifier 613. Signal 623 is the combined signal of the signal amplified by the first amplifier 611, the signal amplified by the second amplifier 612, and the signal amplified by the third amplifier 613. The combined signal 623 of the signals amplified by the three amplifiers 611 to 613 is output through the output terminal Pout.

Figure 7:
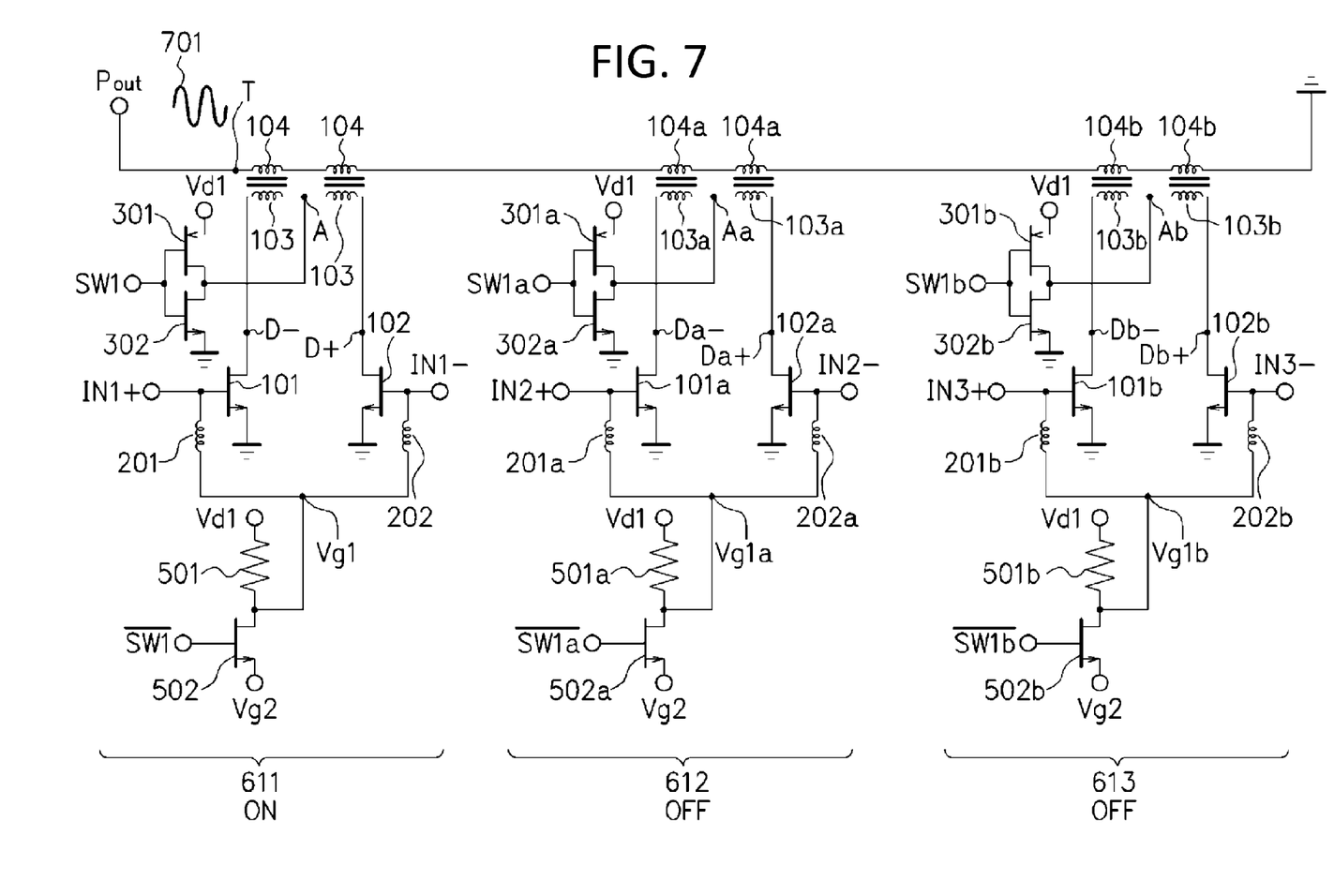
FIG. 7 is a diagram illustrating an exemplary operation of the transceiver including the amplifier circuit according to the third embodiment of the present invention.

FIG. 7 illustrates an exemplary operation of a transceiver including an amplifier circuit according to a third embodiment of the present invention. Any of three amplifiers 611 to 613 can be activated. For example, the first amplifier 611 can be activated and the second and third amplifiers 612 and 613 can be deactivated. Signal 701 is the signal amplified by the first amplifier 611. Signal 701 amplified only by the single amplifier 611 is output from the output terminal Pout.

In a radio transceiver, signal output power is changed according to the communication distance in order to reduce power consumption. The amplifier circuit of the embodiment can be used in the last stage of a radio communication transmitter to allow the transmitter to operate with the optimum power efficiency at all times by changing the number of active amplifiers 611 to 613 according to the signal output power requested.

As has been described above, according to any of the first to third embodiments, the first and second field-effect transistors 101 and 102 can be activated to perform amplification by connecting the power-supply potential node Vd1 to node A at the midpoint of the first primary inductor 103. On the other hand, the first and the second field-effect transistors 101 and 102 can be deactivated to prevent unnecessary power loss by connecting the reference potential node GND to node A at the midpoint of the first primary inductor 103. In addition, since the first switch circuit formed by the transistors 301 and 302 does not adversely affect the amplification, degradation of high-frequency characteristics can be avoided.

The embodiments described above are merely illustrative of ways in which the present invention is carried out and may not be construed to be limitative of the technical scope of the present invention. The present invention can be carried out in various ways without departing from the technical spirit or primary features of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifier circuit comprising:
a first field-effect transistor including a first gate, a first source and a first drain, the first gate receiving one of differential signals, and the first source being connected to a reference potential node;
a second field-effect transistor including a second gate, a second source and a second drain, the second gate receiving the other of the differential signals, and the second source being connected to a reference potential node;
a first transformer including a first primary inductor and a first secondary inductor which are magnetically coupled together, the first primary inductor being connected between the first drain of the first field-effect transistor and the second drain of the second field-effect transistor, and the first secondary inductor being connected between an output terminal and a reference potential node;
a first switch circuit connecting a power-supply potential node or a reference potential node to a midpoint of the first primary inductor; a first inductor connected between the first gate of the first field-effect transistor and a gate bias node; a second inductor connected between the second gate of the second field-effect transistor and the gate bias node; and a bias switch circuit connecting a first bias node or a second bias node to the gate bias node.

2. The amplifier circuit according to claim 1, wherein:
the first bias node has a higher potential than the second bias node;
when the first switch circuit connects the power-supply potential node to the midpoint of the first primary inductor, the bias switch circuit connects the second bias node to the gate bias node; and
when the first switch circuit connects the reference potential node to the midpoint of the first primary inductor, the bias switch circuit connects the first bias node to the gate bias node.

3. The amplifier circuit according to claim 1, wherein:
when the first switch circuit connects the power-supply potential node to the midpoint of the first primary inductor, the differential signals are input to the first gate of the first field-effect transistor and the second gate of the second field-effect transistor; and
when the first switch circuit connects the reference potential node to the midpoint of the first primary inductor, the differential signals are prevented from being input to the first gate of the first field-effect transistor and the second gate of the second field-effect transistor.

4. The amplifier circuit according to claim 1, wherein the first switch circuit is an inverter.

5. The amplifier circuit according to claim 1, further comprising:
a third field-effect transistor including a third gate, a third source and a third drain, the third gate receiving one of the differential signals, and the third source being connected to a reference potential node;
a fourth field-effect transistor including a fourth gate, a fourth source and a fourth drain, the fourth gate receiving the other of the differential signals, and the fourth source being connected to a reference potential node;
a second transformer including a second primary inductor and a second secondary inductor which are magnetically coupled together, the second primary inductor being connected between the third drain of the third field-effect transistor and the fourth drain of the fourth field-effect transistor, and the second secondary inductor being connected with the first secondary inductor in series between the output terminal and a reference potential node; and
a second switch circuit connecting a power-supply potential node or a reference potential node to a midpoint of the second primary inductor.

6. A transceiver comprising:
a first field-effect transistor including a first gate, a first source and a first drain, the first gate receiving one of differential signals, and the first source being connected to a reference potential node;
a second field-effect transistor including a second gate, a second source and a second drain, the second gate receiving the other of the differential signals, and the second source being connected to a reference potential node;
a first transformer including a first primary inductor and a first secondary inductor which are magnetically coupled together, the first primary inductor being connected between the first drain of the first field-effect transistor and the second drain of the second field-effect transistor, and the first secondary inductor being connected between an output terminal and a reference potential node; and
a first switch circuit connecting a power-supply potential node or a reference potential node to a midpoint of the first primary inductor; a first inductor connected between the first gate of the first field-effect transistor and a gate bias node; a second inductor connected between the second gate of the second field-effect transistor and the gate bias node; and a bias switch circuit connecting a first bias node or a second bias node to the gate bias node.

7. The transceiver according to claim 6, wherein:
the first bias node has a higher potential than the second bias node;
when the first switch circuit connects the power-supply potential node to the midpoint of the first primary inductor, the bias switch circuit connects the second bias node to the gate bias node; and when the first switch circuit connects the reference potential node to the midpoint of the first primary inductor, the bias switch circuit connects the first bias node to the gate bias node.

8. The transceiver according to claim 6, wherein:

when the first switch circuit connects the power-supply potential node to the midpoint of the first primary inductor, the differential signals are input to the first gate of the first field-effect transistor and the second gate of the second field-effect transistor; and when the first switch circuit connects the reference potential node to the midpoint of the first primary inductor, the differential signals are prevented from being input to the first gate of the first field-effect transistor and the second gate of the second field-effect transistor.

9. The transceiver according to claim 6, wherein the first switch circuit is an inverter.

10. The transceiver according to claim 6, further comprising:

a third field-effect transistor including a third gate, a third source and a third drain, the third gate receiving one of the differential signals, and the third source being connected to a reference potential node;

a fourth field-effect transistor including a fourth gate, a fourth source and a fourth drain, the fourth gate receiving the other of the differential signals, and the fourth source being connected to a reference potential node;

a second transformer including a second primary inductor and a second secondary inductor which are magnetically coupled together, the second primary inductor being connected between the third drain of the third field-effect transistor and the fourth drain of the fourth field-effect transistor, and the second secondary inductor being connected with the first secondary inductor in series between the output terminal and a reference potential node; and a second switch circuit connecting a power-supply potential node or a reference potential node to a midpoint of the second primary inductor.

* * * * *